(12) United States Patent
Dörrich et al.

(10) Patent No.: US 7,775,061 B2
(45) Date of Patent: Aug. 17, 2010

(54) UNIT ARRANGEMENT

(75) Inventors: Martin Dörrich, Mittenaar (DE); Michael Nicolai, Allertshausen (DE)

(73) Assignee: Rittal GmbH & Co. KG, Herborn (DE)

( * ) Notice: Subject to any disclaimer, the term of this patent is extended or adjusted under 35 U.S.C. 154(b) by 968 days.

(21) Appl. No.: 11/371,621

(22) Filed: Mar. 9, 2006

(65) Prior Publication Data

US 2006/0225449 A1 Oct. 12, 2006

(30) Foreign Application Priority Data

Mar. 9, 2005 (DE) .................... 10 2005 011 179

(51) Int. Cl.
*F25D 23/12* (2006.01)
(52) U.S. Cl. ..................... 62/259.2; 62/186
(58) Field of Classification Search ............. 62/259.2, 62/186, 208; 361/688, 678
See application file for complete search history.

(56) References Cited

U.S. PATENT DOCUMENTS 5,333,676 A * 8/1994 Mizuno ................. 165/294
6,041,851 A * 3/2000 Diebel et al. ........... 165/104.33
6,957,170 B2 * 10/2005 Laurosch et al. ............ 702/184

FOREIGN PATENT DOCUMENTS

DE 197 12 474 C1 1/1998

* cited by examiner

*Primary Examiner*—Melvin Jones
(74) *Attorney, Agent, or Firm*—Pauley Petersen & Erickson

(57) ABSTRACT

A unit arrangement having a receiving housing, in particular a switchgear cabinet, in an interior of which electrical units are accommodated and having a cooling device which is in air-conducting communication with the interior of the receiving housing via at least one air inlet and at least one blower aperture, and a cooling operation monitoring device. A requirement-orientated control of the cooling operation is possible when the cooling operation monitoring device has an inlet temperature sensor which measures a temperature of the air to be cooled which is supplied to the cooling unit via the air inlet. An outlet temperature sensor measures a temperature of the cooled air which is supplied to the interior of the receiving housing via the blower aperture. A computing unit of the cooling operation monitoring device determines a temperature difference between the temperature measured by the inlet temperature sensor and the outlet temperature sensor.

9 Claims, 3 Drawing Sheets

UNIT ARRANGEMENT

BACKGROUND OF THE INVENTION

1. Field of the Invention

This invention relates to a unit arrangement having a receiving housing, particularly a switchgear cabinet, in the interior of which electrical units are accommodated and having a cooling unit which is in air-conducting communication with an interior of the receiving housing via at least one air inlet and at least one blower aperture, and a provided cooling operation monitoring device.

2. Discussion of Related Art

A unit arrangement is known from German Patent Reference DE 197 12 474. In this document, a cooling unit is described which can be mounted on a side wall of a switchgear cabinet. The side wall also has two through-openings. Through one of the through-openings, warm switchgear cabinet air is drawn in by a fan and supplied to a heat exchanger of the cooling unit.

The cooled air can then be supplied again to the switchgear cabinet interior through the second through-opening. Control of the cooling power is effected normally with a temperature sensor which is disposed in the interior of the switchgear cabinet. With a control circuit, the operation of the cooling unit can be controlled as a function of the measured temperature.

Sensitive electrical units are frequently mounted in the interior of the switchgear cabinet. During operation, the electrical units must be cooled continuously. For example, blade servers are used which discharge a high heat loss. The blade servers have a conductive structure through which the cooling air must be conveyed. With the producer, the insufflation temperature into the conductive structure is prescribed. For spatial reasons, increasingly a high packing density is required in an interior of the switchgear cabinet. Correspondingly, the electrical units affect each other thermally and there is a danger of inadequate cooling power.

SUMMARY OF THE INVENTION

It is one object of this invention to provide a unit arrangement of the type mentioned above but in which a requirement-orientated control of the cooling power is possible.

This object is achieved if the cooling operation monitoring device has an inlet temperature sensor which measures the temperature of the air to be cooled, which is supplied to the cooling unit via the air inlet. An outlet temperature sensor measures the temperature of the cooled air which is supplied to the interior of the receiving housing via the blower aperture. A computing unit of the cooling operation monitoring device determines the temperature difference between the temperature measured by the inlet and outlet temperature sensor.

With this arrangement, the heating of the cooling air when passing through the electrical unit which is to be cooled can be detected via the temperature difference measurement. Threshold values for the temperature difference can be formed, impermissible operation occurring when the temperature difference is exceeded, and the cooling unit then can be subsequently regulated. With this arrangement, in particular the permissible inlet temperature can also be maintained, because the air temperature before entry into the electrical unit is determined by the outlet temperature sensor. Both the inlet and the outlet temperature sensors can be directly associated with the cooling unit or the interior of the switchgear cabinet.

According to a preferred embodiment of this invention, the computing unit transmits to a control module a switch signal which corresponds to the temperature difference and the control module controls the cooling power of the cooling unit as a function of the switch signal. Regulation of the cooling power can thus be achieved in a simple manner if the control module controls the number of revolutions of at least one fan of the cooling unit as a function of the switch signal. Thus, the cooling power volume flow is increased, also the inlet temperature in the electrical unit can be maintained constant, if required.

In a cost-effective embodiment of the cooling unit, the fan is an alternating current fan which can be operated in steps of numbers of revolutions which are strictly prescribed as a function of the control command prescribed by the control module. The variation in the number of revolutions of the alternating current fan can be effected simply by various current tappings. A complex electronic regulating unit is then not required.

In another embodiment of this invention, a cooling medium can be supplied via a pilot line to the cooling unit and discharged therefrom via a return line, and the flow of the cooling medium can be controlled by a solenoid valve, as a function of the temperature signal which is determined by the outlet temperature sensor. The cold feed to the cooling unit via the cooling medium can thus be regulated. The outlet temperature sensor, which also detects the temperature at the inlet of the electrical unit, prescribes the size of the cold feed, in order not to deviate from the permissible temperature range at the inlet of the electrical unit.

In order to determine the quantity of heat which is currently cooled, a cooling medium can be supplied to the cooling unit via a pilot line and discharged via a return line. A temperature sensor is associated with the pilot line and with the return line respectively, and a computing unit forms a difference signal which corresponds to the temperature difference. A volume flow meter is associated with the cooling unit or with the pilot line or with the return line and the computing unit determines the quantity of heat from the difference signal and from the signal of the volume flow meter and transmits a signal which corresponds to the quantity of heat to a display unit. The user can compare this value with the maximum possible power level of the cooling unit. If there is a difference, there is still a reserve for extension and the user can decide whether to accommodate electrical units also in the interior of the switchgear cabinet.

BRIEF DESCRIPTION OF THE DRAWINGS

This invention is explained in more detail in view of one embodiment represented in the drawings, wherein.

DESCRIPTION OF PREFERRED EMBODIMENTS

Figure 1:
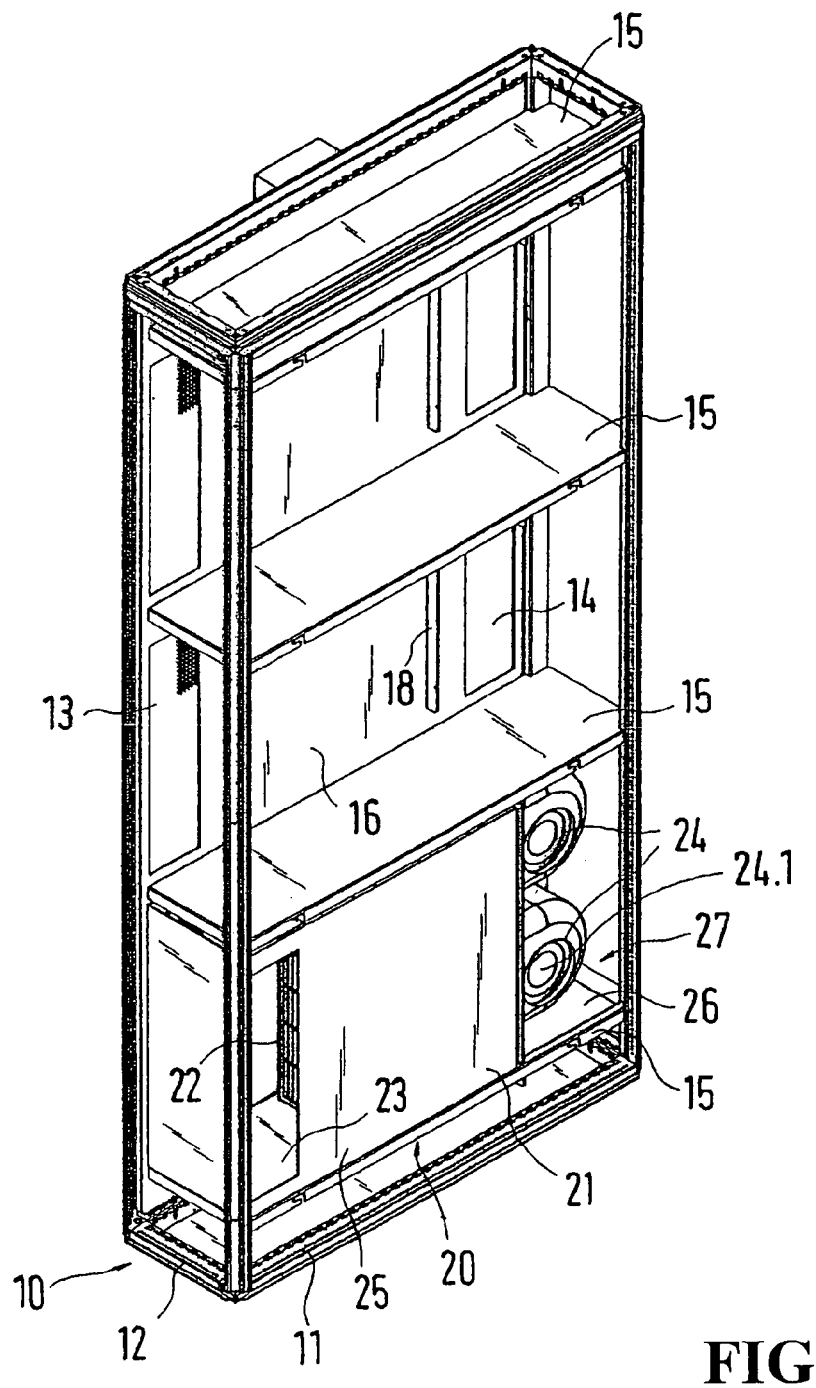
FIG. 1 shows a cooling unit in a perspective side view.

FIG. 1 shows a cooling unit 10 having a frame. This is assembled from twelve frame profiles 11, 12. The horizontal frame profiles 11, 12 form a base and a cover frame, in corner regions of which are welded the four vertical frame profiles which have identical cross-sections. The receiving chamber surrounded by the frame is subdivided into three partial receiving chambers by horizontal compartment bases 15. The partial receiving chambers can be covered on both sides on the frame broad sides by lateral covers 16. Each of the covers 16 has an air inlet 14 and a blower aperture 13. The front-side and rear-side narrow sides and also the roof side of the frame 15 are covered with suitable screens. The compartment bases 15 are fixed to the vertical frame profiles and receive one cooling module 20 respectively. Each cooling module 20 is assembled from two constructional units, a heat exchanger unit 21 and a fan unit 24.

The heat exchanger unit 21 has a heat exchanger housing 25, in which an air-water heat exchanger 22 is incorporated. The heat exchanger housing 25 has two blower apertures 23 which can be aligned relative to the blower aperture 13 of the cover 16.

The fan unit 24 has a fan housing 26, which receives two fans 24.1. The fan housing 26 is in air-conducting communication with the air inlets 14 of the covers 16 via its open sides 27.

In order to assemble the cooling module 20, the heat exchanger unit 21 is inserted through the open front side of the frame between the two vertical frame profiles on the compartment base 15 into the associated partial receiving chamber until the heat exchanger housing 25 delimits the insertion movement on a limit stop 18 of the covers 16. Similarly, the fan unit 24 is inserted from the rear side of the frame on the compartment base 15 which serves as a sliding guide into the partial receiving chamber. The limit stop 18 again delimits the insertion movement.

Figure 2:
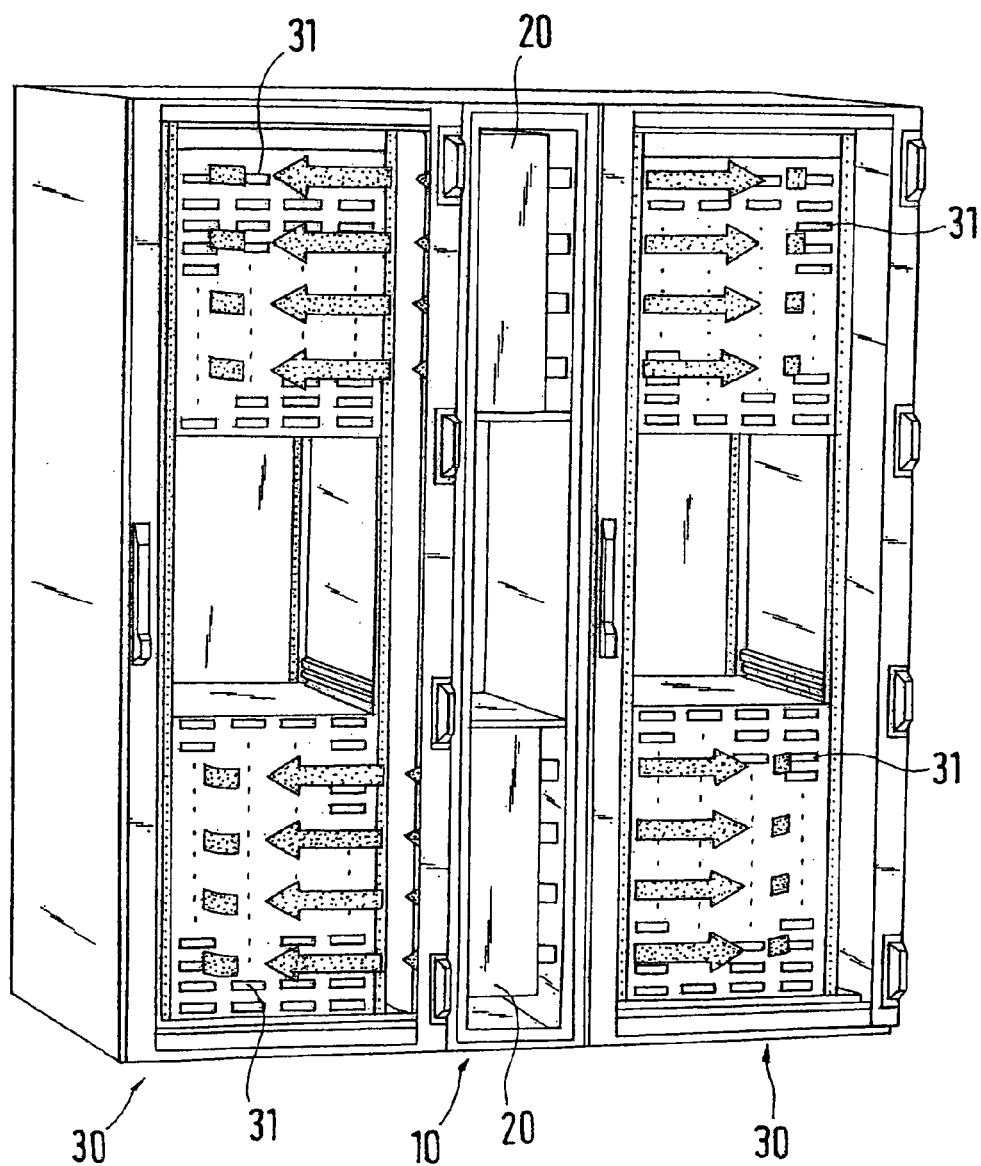
FIG. 2 shows a perspective view of a unit arrangement having two switchgear cabinets and the air conditioning unit shown in FIG. 1.

The cooling unit 10 shown in FIG. 1 can be incorporated in a unit arrangement as is shown, for example, in FIG. 2. The cooling unit 10 is thus incorporated between two switchgear cabinets 30. The switchgear cabinets 30 are constructed conventionally in their design and have a frame which is clad with wall elements and a front-side door. On the switchgear cabinet sides which are orientated towards each other, the cooling unit 10 replaces the wall element.

The switchgear cabinets 30 are, as shown in the drawing, fitted respectively with two server units, electrical units 31, which respectively can have a plurality of blade servers. A server unit is thus disposed respectively in the roof or base region of the switchgear cabinet 30. Between the two server units, there is an empty chamber, which if necessary, can be fitted with a third server unit for completion of the interior of the switchgear cabinet 30. Corresponding to the layout of the switchgear cabinet 30, the cooling unit 10 receives two cooling modules 20. Each of the cooling modules 20 is in spatial communication with the interior of the two switchgear cabinets 30 via the air inlets 14 and the blower apertures 23. With the fan units 24, air in the region of or near the rear side of the switchgear cabinets 30 can be conveyed via a channel structure of the server units in the direction of the switchgear cabinet depth. This air is cooled in the heat exchanger 22 of the heat exchanger unit 21 and then, in the region of the front side of the switchgear cabinets 30, is guided again via the blower apertures 13 to the channel structure. The switchgear cabinets 30 can also be equipped with a third server unit, and a third cooling module 20 can be simply retrofitted in the cooling unit 10.

If a server unit is retrofitted only in one switchgear cabinet 30, then a cover 16 which does not permit the passage of air is incorporated orientated towards the other switchgear cabinet 30. Thus, all the partial receiving chambers in the switchgear cabinet 30 can be adapted respectively to the individual unit specifications.

The cooling unit 10 can also be constructed solely with one switchgear cabinet 30 alone. The cooling unit side which is orientated away from the switchgear cabinet 30 is then closed with a side wall.

Figure 3:
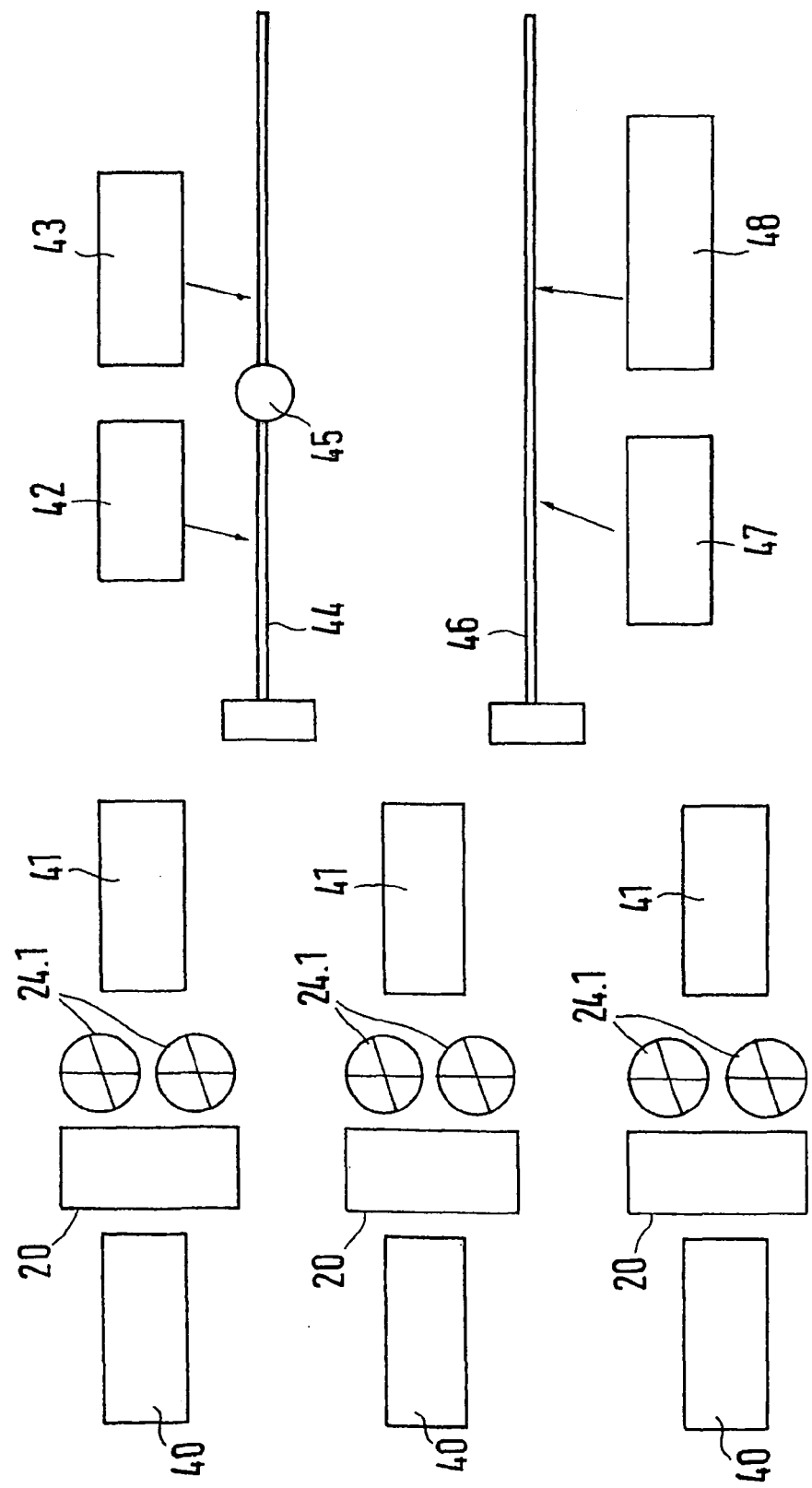
FIG. 3 shows diagrammatic views of a monitoring device for controlling the cooling unit operation.

FIG. 3 shows a monitoring device for the cooling unit 10, according to FIGS. 1 and 2. The cooling modules 20 and also the fans 24.1 of the fan units are shown respectively, different from FIGS. 1 and 2, with the use of three cooling modules 20.

An inlet temperature sensor 40 is disposed respectively in the air flow in the flow direction in front of the cooling module 20 and also an outlet temperature sensor 41 is disposed respectively after the cooling modules 20.

The inlet temperature sensor 40 determines the temperature of the air flow in the region of the air inlet, and thus the temperature which the air flow has after leaving or exiting the electrical unit 31. The outlet temperature sensor 41 determines the temperature of the cooled air after it has passed through the heat exchanger unit. A difference signal ($\Delta t$) is formed from the temperatures which are determined by the inlet and outlet temperature sensors 40, 41. If the difference signal falls below or exceeds a prescribed reference value, a control signal is emitted from a control unit, with which signal the number of revolutions of the fans 24.1 is subsequently regulated.

When fallen below, the number of revolutions is increased in order to increase the cooling air volume flow. Being exceeded leads to a reduction in the number of revolutions. Thus, an energy-saving adaptation to different operating conditions can be effected. The temperature of the cooling air which is blown through the blower aperture 13 in front of the electrical units 31 should be maintained in a specific temperature range. Too low temperatures lead to condensation. The moisture precipitated from the air can damage the electronics. Thus the temperature of the air which is determined by the outlet temperature sensor 41 must be maintained in a prescribed range and the temperature signal is also connected in a further control function, as explained.

The heat exchanger units 21 have respectively an air-water heat exchanger 22, which is connected via a pilot line 44 and a return line 46 to a cooling water supply. In the pilot line 44, a valve 45 is integrated, with which the through-flow can be regulated. In the simplest, most cost-effective case, the valve 45 is a solenoid valve with two closed states. The valve 45 is triggered as a function of the temperature of the outlet temperature sensor 41.

If the temperature is too low, the pilot line 44 is opened and cooling medium can flow to the air-water heat exchanger 21. Upon falling below a prescribed temperature value, the pilot line 44 is closed by the valve 45 or, as a function of the type of the valve 45 used, the cooling medium flow is reduced.

As shown in FIG. 3, a temperature sensor 43, 47 is associated respectively with the pilot line and the return line 44 and 46, and the sensor 43 there measures the temperature of the cooling medium. From the obtained temperature signals, a difference signal $\Delta t$ can be formed. Also, a volume flow meter 43 is used, which determines the volume flow of the cooling medium in the pilot line 44. According to the formula:

$$\dot{Q} = \dot{m} \cdot \Delta t \cdot cpw$$

the currently cooled quantity of heat can then be determined. This can be communicated to the user on a display unit, so that the user can decide whether a cooling reserve is still present, which if necessary can be used for additional electrical units 31.

German Patent Reference 10 2005 011 179.3, the priority document corresponding to this invention, and its teachings are incorporated, by reference, into this specification.

What is claimed is:

1. A unit arrangement having a receiving housing or a switchgear cabinet (30), in an interior of which electrical units (31) are accommodated and having a cooling unit (10) in air-conducting communication with the interior via at least one air inlet (14) and at least one blower aperture (13), and a cooling operation monitoring device, the unit arrangement comprising:

the cooling operation monitoring device having an inlet temperature sensor (40) measuring a temperature of air to be cooled which is supplied to the cooling unit (10) via the at least one air inlet (14), an outlet temperature sensor measuring a second temperature of cooled air supplied to the interior via the at least one blower aperture (13), and a computing unit of the cooling operation monitoring device determining a temperature difference measured between the inlet temperature sensor and the outlet temperature sensor, a cooling medium supplied via a pilot line (44) to a cooling module (20) and discharged from the cooling module (20) via a return line (46), and a flow of the cooling medium controlled by a solenoid valve (45) as a function of an outlet temperature signal determined by the outlet temperature sensor (41).

2. The unit arrangement according to claim 1, wherein the computing unit transmits to a control module a switch signal which corresponds to the temperature difference, and the control module controls the cooling power of a cooling module (20) as a function of the switch signal.

3. The unit arrangement according to claim 2, wherein the control module controls a number of revolutions of at least one fan (24.1) of the cooling unit as a function of the switch signal.

4. The unit arrangement according to claim 3, wherein the fan (24.1) is an alternating current fan operable in steps of numbers of revolutions which are a function of a control command prescribed by the control module.

5. The unit arrangement according to claim 4, wherein a cooling medium is supplied via a pilot line (44) to the cooling module (20) and discharged from the cooling module (20) via a return line (46), a pilot temperature sensor (42 and 47) is associated with the pilot line (44) and with the return line (46) respectively, a computing unit forms a difference signal which corresponds to the temperature difference, a volume flow meter (43) is associated with one of the cooling module (20), the pilot line (44) and the return line (46), and the computing unit determines a quantity of heat (Q) from the difference signal and the signal of the volume flow meter and transmits a heat signal corresponding to the quantity of heat (Q) to a display unit.

6. A unit arrangement having a receiving housing or a switchgear cabinet (30), in an interior of which electrical units (31) are accommodated and having a cooling unit (10) in air-conducting communication with the interior via at least one air inlet (14) and at least one blower aperture (13), and a cooling operation monitoring device, the unit arrangement comprising:

the cooling operation monitoring device having an inlet temperature sensor (40) measuring a temperature of air to be cooled which is supplied to the cooling unit (10) via the at least one air inlet (14), an outlet temperature sensor measuring a second temperature of cooled air supplied to the interior via the at least one blower aperture (13), and a computing unit of the cooling operation monitoring device determining a temperature difference measured between the inlet temperature sensor and the outlet temperature sensor, a cooling medium supplied via a pilot line (44) to a cooling module (20) and discharged from the cooling module (20) via a return line (46), a pilot temperature sensor (42 and 47) associated with the pilot line (44) and with the return line (46) respectively, a computing unit forming a difference signal which corresponds to the temperature difference, a volume flow meter (43) associated with one of the cooling module (20), the pilot line (44) and the return line (46), and the computing unit determining a quantity of heat (Q) from the difference signal and the signal of the volume flow meter and transmitting a heat signal corresponding to the quantity of heat (Q) to a display unit.

7. The unit arrangement according to claim 6, wherein a cooling medium is supplied via a pilot line (44) to a cooling module (20) and discharged from the cooling module (20) via a return line (46), and a flow of the cooling medium is controlled by a solenoid valve (45) as a function of an outlet temperature signal determined by the outlet temperature sensor (41).

8. A unit arrangement having a receiving housing or a switchgear cabinet (30), in an interior of which electrical units (31) are accommodated and having a cooling unit (10) in air-conducting communication with the interior via at least one air inlet (14) and at least one blower aperture (13), and a cooling operation monitoring device, the unit arrangement comprising:

the cooling operation monitoring device having an inlet temperature sensor (40) disposed in an air flow through the at least one air inlet (14) and measuring a temperature of air to be cooled which is supplied to the cooling unit (10) via the at least one air inlet (14), an outlet temperature sensor disposed in an air flow through the at least one blower aperture (13) and measuring a second temperature of cooled air supplied to the interior via the at least one blower aperture (13), and a computing unit of the cooling operation monitoring device determining a temperature difference measured between the inlet temperature sensor and the outlet temperature sensor.

9. A unit arrangement having a receiving housing or a switchgear cabinet, in an interior of which electrical units are accommodated, the unit arrangement comprising:

a cooling unit in air-conducting communication with the interior via an air inlet and a blower aperture;

a cooling operation monitoring device in communication with the cooling unit;

an inlet temperature sensor disposed in an air flow through the air inlet and measuring a temperature of air in the air flow to be cooled;

an outlet temperature sensor disposed in a cooled air flow through the blower aperture and measuring a second temperature of cooled air in the cooled air flow; and a computing unit of the cooling operation monitoring device determining a temperature difference measured between the inlet temperature sensor and the outlet temperature sensor.

* * * * *